United States Patent [19]

Sato et al.

[11] Patent Number: 4,828,947

[45] Date of Patent: May 9, 1989

[54] METHOD FOR MAKING A RELIEF PATTERN OF A CURED RESIN ON A TRANSPARENT COLORED LAYER

[75] Inventors: Shigehiro Sato, Osaka; Tokihiko Shimizu, Nara, both of Japan

[73] Assignee: Matsushita Electric Industrial Co., Ltd., Japan

[21] Appl. No.: 98,999

[22] Filed: Sep. 21, 1987

[30] Foreign Application Priority Data

Sep. 19, 1986 [JP] Japan .............................. 61-223009
Sep. 26, 1986 [JP] Japan .............................. 61-228996

[51] Int. Cl.$^4$ ............................................. G03F 1/02
[52] U.S. Cl. .......................................... 430/7; 430/20; 430/145; 430/176; 430/321; 430/327; 430/330; 430/909
[58] Field of Search ................. 430/909, 327, 321, 20, 430/330, 4, 7, 145, 176, 175, 950, 271; 350/339 F

[56] References Cited

U.S. PATENT DOCUMENTS

| | | |
|---|---|---|
| 4,116,693 | 9/1978 | Levinos .......................... 430/327 X |
| 4,131,466 | 12/1978 | Nomura et al. ................. 430/176 X |
| 4,357,415 | 11/1982 | Hartman ............................. 430/293 |
| 4,537,851 | 8/1985 | Nonagaki et al. .................... 430/144 |
| 4,564,581 | 1/1986 | Curtis et al. ........................ 430/308 |
| 4,614,701 | 9/1986 | Mori et al. .......................... 430/175 |
| 4,632,514 | 12/1986 | Ogawa et al. ................... 350/339 F |

OTHER PUBLICATIONS

"Twisted-Nematic Liquid-Crystal Full-Color Display Panel with Reduced Rotatory Dispersion" by Seiichi Nagata et al.; 84.SID 85 Digest, 1985, pp. 84-85.

Primary Examiner—Jose G. Dees
Attorney, Agent, or Firm—Lowe, Price, LeBlanc, Becker & Shur

[57] ABSTRACT

A method for making a relief pattern of a cured resin on a transparent colored layer which comprises applying a coating of a photocurable resin composition whose spectral sensitivity varies depending on the pH of the composition, on a transparent colored layer, adjusting the pH of the composition to a predetermined level, and exposing the coating to visible light irradiation through the transparent colored layer. The irradiated layer is developed to obtain a relief pattern corresponding to visible spectra transmitted through the transparent colored layer.

12 Claims, 3 Drawing Sheets

METHOD FOR MAKING A RELIEF PATTERN OF A CURED RESIN ON A TRANSPARENT COLORED LAYER

BACKGROUND OF THE INVENTION

1. Field of the Invention

This invention relates to a method for making a relief pattern of a cured resin on a transparent colored layer by the use of a photocurable or photocrosslinking material or composition. This method may be applied to the fabrication of a color filter for liquid crystal displays in which a relief pattern is formed on color pixels of a the transparent colored layer of the filter.

2. Description of the Prior Art

As is known in the art, a liquid crystal used in a liquid crystal display has an inherent refraction anisotropy. In order to obtain high quality full-color LTV images, it is essential that the display have a multi-gap structure with optimum cell gaps for the respective red, green and blue color pixels.

In prior art processes of making a color filter having such a multi-gap structure, it is usual to apply a dyeing photosensitive material, such as modified proteins or synthetic dyeing resins sensitized with dichromates or diazonium salts, onto a glass substrate and to subject the applied material to patterning, after which the resultant patterned layers are, respectively, dyed with dye solutions, i.e. the dyeing procedure is repeated three times to make red, green and blue color pixels. In this connection, however, the respective pixels must be properly controlled in thickness. This is usually made by finely controlling a coating amount of the dyeing photosensitive material on the glass substrate. However, such a fine control is very difficult because of the swelling of the resin after dyeing, thus presenting the problem that the thicknesses of the respective pixels can rarely be controlled as desired.

For the formation of a stepped relief on the transparent colored layer composed of the color pixels, photocurable or photocrosslinking polymers or compositions are used. In general, the types of the polymers or compositions can be broadly classified as follows.

(1) A photosensitive material is used and excited by absorption of light and acts on a dispersion polymer medium to harden the polymer by crosslinkage.

(2) If satisfactory sensitivity cannot be obtained by the use of a photo-crosslinking agent alone, a sensitizer is used by mixing with the photo-crosslinking agent. The photo-crosslinking agent is excited by occurrence of energy transfer from the sensitizer toward the photo-crosslinking agent and reacts with polymer chains.

(3) Polymers having a photosensitive group are used and this group is optically excited and combined with other functional groups.

(4) The polymers in (3) are used in combination with sensitizers to facilitate the photo-excitation.

With (1) and (2), the spectral sensitivity for the photo curing corresponds substantially to the absorption spectrum of a photosensitive material or a photosensitive group. With (2) and (4), the spectral sensitivity is determined by combination of a photosensitive material and a sensitizer. Accordingly, it is necessary that the control of the spectral sensitivity of a photosensitive resin be made by proper selection of a photosensitive material or by addition of an appropriate type of dye sensitizer.

Nevertheless, it is not possible to arbitrarily change the spectral sensitivity and thus, it has not been possible to form on the surface of a colored transparent layer a desired relief pattern corresponding to a visible transmission spectrum.

SUMMARY OF THE INVENTION

It is therefore an object of the present invention to provide a method for making a desired relief pattern of a cured resin on an optically transparent colored layer of different color regions in which the relief pattern is formed by application of a visible transmission spectrum to a curable resin layer through the respective color regions.

It is another object of the invention to provide a method for making a color filter of the multi-gap structure type having a substrate, and a transparent layer of color pixels formed on the substrate, a stepped relief pattern being formed, as desired, on the transparent layer by utilizing a variation in spectral sensitivity depending on the pH of a photopolymerizable material.

In accordance with one embodiment of the invention, there is provided a method for making a relief pattern on an optically transparent colored layer having different color regions. The method comprises applying a photocurable resin composition, whose spectral sensitivity depends on the pH of the composition, onto the colored transparent layer, adjusting the pH of the composition to a predetermined level, subjecting the layer of the composition to actinic visible light irradiation through the colored transparent layer to cure the composition in the respective regions of the resin layer on the different color regions in such different degrees which depend on the light transmission through the color regions, and developing the irradiated layer to form a relief pattern of the cured resin on the colored layer. When the layer of the composition is irradiated with actinic visible light through the colored transparent layer, the light is partly absorbed in the respective color regions of the transparent layer depending upon the color. Light energy absorbed in the composition layer which will differ by absorption in the respective color regions of the transparent layer takes part in the photocuring or photocrosslinking of the photocurable resin in the composition, so that the photocurable composition formed on the respective color regions is cured or hardened in different degrees in regions corresponding to the light transmitted through the color regions. When the photocured composition layer is developed such as by washing with water, a relief pattern is left on the transparent colored layer corresponding to the degree of photocuring of the photocurable composition. With regions where the curing proceeds to a substantial extent, the material or resin in the region is left after the development. On the other hand, with regions or portions of the layer where the photocuring does rarely proceed, the layer in the region can readily be removed by the development. In the above embodiment, an optically tranparent substrate may be used to form the colored transparent layer on the other side with respect to the relief pattern.

In accordance with a more specific embodiment of the present invention, there is also provided a method for making a relief pattern of a cured resin formed on a colored transparent layer of red, green and blue color pixels of a color filter for liquid crystal displays. The method comprises applying a photocurable composition onto the transparent colored layer, whose spectral sensitivity depends on the pH of the composition, onto the transparent layer, adjusting the pH of the composition to a predetermined level, subjecting the layer of the composition to actinic visible light irradiation through the transparent colored layer to photocure the composition in the respective regions on the color pixels in such different degrees that depend on the light transmission through the color pixels, and developing the irradiated layer to form a relief pattern of the photocured layer. The color filter obtained by this embodiment is used for a cell of the multi-gap structure type in which the photocured layer is stepped to have different thicknesses on the respective color pixels.

DETAILED DESCRIPTION AND EMBODIMENTS OF THE INVENTION

The present invention is based on the finding or is characterized in that the spectral sensitivity of a photocurable material or composition in a visible light region varies as the pH varies and thus, the spectral sensitivity can be arbitrarily selected by a suitable control of the pH value. This means that if a photocurable material or composition is exposed to light through a transparent colored layer having different color sections or regions, the material or composition is cured according to the visible light spectra transmitted through the respective color regions, thereby obtaining a relief having thicknesses corresponding to the transmitted visible light spectra.

Reference is now made to the accompanying drawings and particularly, to FIG. 1 which illustrates the method according to the invention. In the figure, formation of a stepped relief pattern on a color filter for liquid crystal displays is illustrated. Although the color filter has a transparent colored layer consisting of a multitude of pixels of three different colors arranged in a certain order, it is sufficient in the practice of the invention that a transparent colored layer includes at least two regions of different colors if it is desired that a relief pattern is formed on such at least two regions.

Figure 1A:
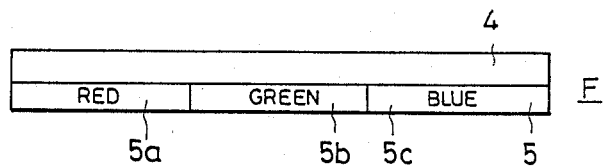
FIGS. 1a to 1e are views illustrative of a process for making a stepped relief pattern on a colored transparent layer of color pixels according to a visible transmission spectrum.

In FIG. 1a, there is shown a part of a color filter F which includes an optically tranparent substrate or base 4 and an optically transparent layer 5 of red, green and blue color pixels 5a, 5b, 5c formed on one side of the substrate 4. The transparent substrate 4 may be glasses or any known transparent plastic resins such as epoxy resins, polycarbonate resins, acrylic resins and the like, and is in the form of a sheet or plate. The transparent colored layer 5 may be formed by known techniques. For instance, a dichromate or diazonium salt is added to a dyeing resin to impart the photosensitivity, followed by patterning and dyeing with suitable dyes. Alternatively, a photoresist may be applied onto a dyeing resin layer and subjected to patterning, and dyed as desired. As a matter of course, other known methods including printing, color photography and polymer electrodeposition may be used for the formation of the transparent colored layer 5. If desired, the substrate 4 itself may be colored after patterning.

Figure 1B:
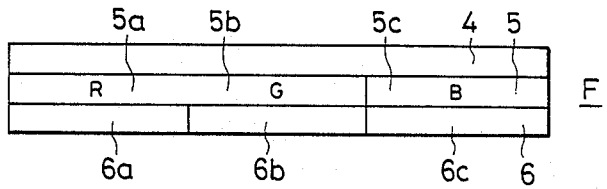
Figure 1C:
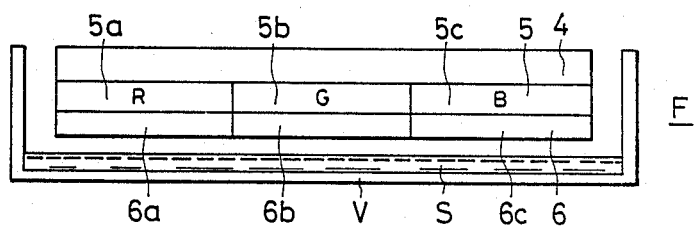
Figure 1D:
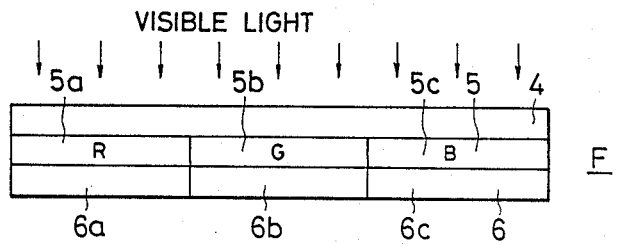

In a subsequent step as shown in FIG. 1b, a photocurable material or composition whose spectral sensitivity in a visible light region varies depending on the pH thereof is applied onto the transparent colored layer 5 in a dry thickness of 1 to 5 micrometers, thereby forming a layer 6 having regions 6a, 6b and 6c corresponding to the color pixels 5a, 5b and 5c, respectively.

The photocurable materials or compositions useful in the practice of the invention may be combinations of polymer materials and crosslinking agents. Such combinations are advantageous in that when the crosslinking agents used vary in spectral sensitivity according to the variation in pH, various types of polymer materials may be used for this purpose.

Useful crosslinking agents are diazo compounds or azide compounds having a group capable of reversibly undergoing proton addition or elimination when the pH changes, e.g. an amino group or a carboxyl group, and a group having an absorbance in a visible light region, e.g. a phenyl group or a conjugated poly-ene. Specific examples of the crosslinking agents include 4,4'-bisdiazodiphenylamine dichloride, N-methyl-4,4'-bisdiazodiphenylamine dichloride and the like. Of these, 4,4'-bisdiazodiphenylamine dichloride of the following formula is preferred.

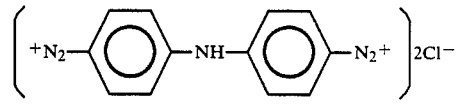

The polymer materials used in combination with the crosslinking agent are water-soluble polymers miscible with or capable of dissolving the crosslinking agent. Especially, when bisdiazodiphenylamines are used as the crosslinking agent, gelatin, casein, polyvinyl alcohol and the like are preferably used. In general, the crosslinking agent is used in an amount of from 0.5 to 5 wt% of the water-soluble polymer. In practice, the water-soluble polymer and the crosslinking agent are applied onto the transparent colored layer in the form of an aqueous solution. If desired, the applied layer may be pre-baked or dried at 20° to 80° C. for a time sufficient to form a dried layer 6.

The photocurable composition layer 6 is then adjusted in pH to a predetermined level which depends on the type of photopolymerizable composition or the type of crosslinking agent. The adjustment is effected by exposing the layer 6 to an acidic or basic gas. To this end, the substrate 4 having the layer 6 is placed in a vessel V containing an aqueous solution S capable of generating an acidic gas such as hydrochloric acid or acetic acid or capable of generating a basic gas such as ammonia, so that the layer 6 is exposed to the acidic or basic gas. This is particularly shown in FIG. 1c. The exposure time may depend on the thickness of the layer 6 and is generally within a range of from 2 to 30 seconds. The pH is preferably adjusted to not higher than 8.

Alternatively, the pH adjustment may be effected by addition of a suitable acidic or basic substance to the photocurable composition.

Figure 2:
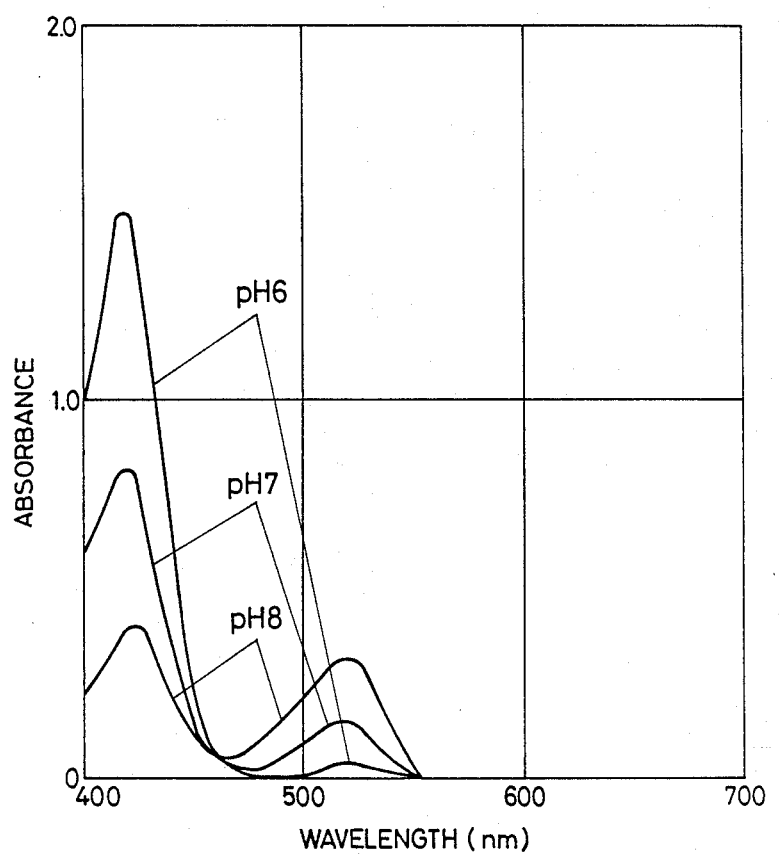
FIG. 2 is a graphical representation of the relation between wavelength and visible light absorption spectrum for different pH values.

The pH dependence of 4,4'-bisdiazodiphenylamine dichloride with respect to the absorption spectrum is shown in FIG. 2. From this figure, it will be seen that the compound has two absorption peaks at 420 and 520 nm and these absorption peaks vary considerably depending on the pH.

The pH-adjusted layer 6 is subsequently exposed to visible light through the transparent colored layer 5, whereupon the visible light is partially absorbed in the respective color pixels. The light energies passed through the respective color pixels 5a, 5b and 5c are different from one another and reach the layer 6, in which the crosslinking agent is sensitized in degrees corresponding to the energies of the passed light, respectively. Accordingly, the amounts of light passing to the regions 6a, 6b and 6c of the layer 6 differ, so that the polymer in the respective regions 6a, 6b and 6c undergoes crosslinkage in different degrees.

The visible light source may be various lamps capable of generating visible light such as xenon arc lamps, carbon arc lamps, fluorescent lamps, halogen lamps and the like. The light irradiation time should be suitably determined according to the type of crosslinking agent and is ordinarily in the range of from 1 to 60 seconds.

Figure 1E:
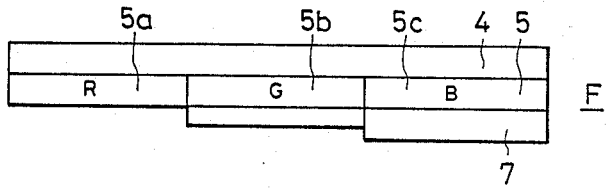

After the light irradiation, the layer 6 is subjected to development to obtain a relief 7 as shown in FIG. 1e. The development is usually effected by washing the layer 6 with water since the water-soluble polymer is used as the layer 6. Alternatively, a spinning development with water or a shower development with water may also be used. During the development, the polymer in the layer 6 is removed according to the degree of crosslinkage in the respective regions 6a, 6b and 6c to form the relief 7. In FIG. 1e, it is shown that the region 6a on the red color pixel 5a is completely removed, the region 6b on the green color pixel 5b is removed to an extent, and the region 6c on the blue color pixel 5c is left substantially as it is. However, any desired relief pattern may be arbitrarily made by changing the pH, the type of crosslinking agent, the color in the transparent colored layer and the like.

After the development, the results relief pattern may be post-baked to ensure the photocuring at a temperature of 80° to 150° C. for a sufficient time.

In the above embodiment, the transparent colored layer is made of color pixels, but any type of transparent colored layer having colored regions of a desired form may be used in order to form a relief pattern thereon according to the method of the invention. The method of the invention may be applied to the fabrication of printing plates other than the color filter.

The present invention is more particularly described by way of examples.

EXAMPLE 1

Figure 3:
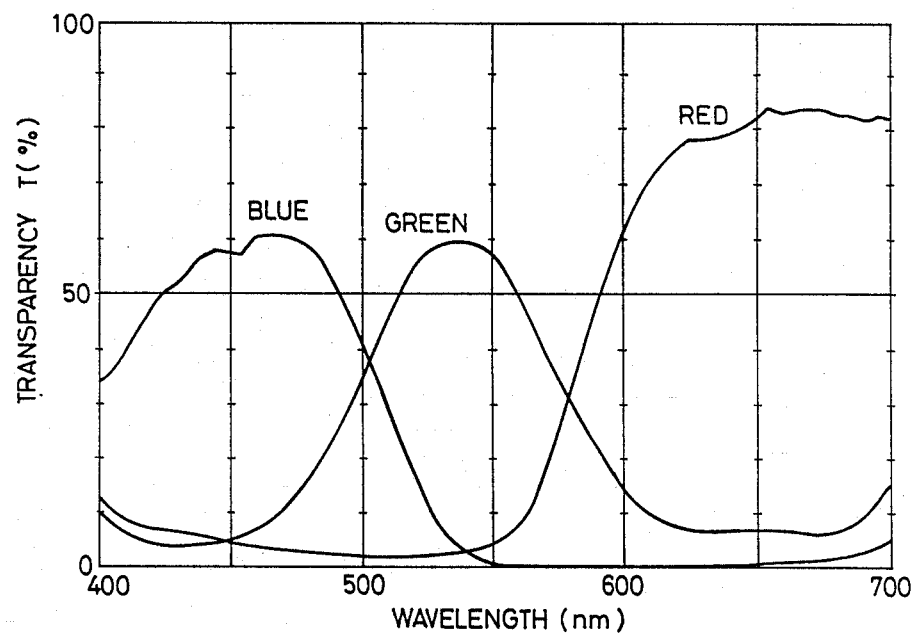
FIG. 3 is a graphical representation of the relation between wavelength and transparency for different color pixels.

A coating of a dichromate in gelatin was formed on a quartz glass disk plate having a diameter of 50 mm, followed by repeating a patterning and dyeing procedure for red, green and blue dyes, thereby forming a colored transparent layer having red, green and blue color pixels. The layer thickness was 1.0 micrometer. The visible light transmission spectrum of the colored transparent layer is shown in FIG. 3.

A photocurable composition was prepared by dissolving 10 parts by weight of polyvinyl alcohol (PVA117, made by Kurare Co., Ltd.) dissolved in 90 parts by weight of distilled water and adding to the resultant solution 0.2 parts by weight of 4,4'-bisdiazodiphenylamine dichloride of the following formula:

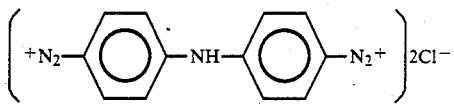

The resultant coating composition was applied onto the transparent colored layer in a dry thickness of 1.3 micrometers. The photocurable composition after removal of the water was found to have an absorption spectrum for different pH values as shown in FIG. 2. Thus, the spectral sensitivity of the composition varies considerably depending on the pH of the composition.

The applied layer on the colored transparent layer was pre-baked at 40° C. for 20 minutes and was placed in face-to-face relation to a 1% ammonia solution at a distance of 5 cm from the solution so that the layer was exposed to the ammonia vapor for different times indicated in Table 1. In this manner, the photocurable composition layer was adjusted in pH to given levels, thereby obtaining photosensitive plate sample Nos. 1 to 4.

EXAMPLE 2

A colored transparent layer was formed on a quartz glass disk plate having a diameter of 50 mm in the same manner as in Example 1. The layer thickness was 1 micrometer. A photocurable composition was prepared by adding 0.2 parts by weight of 4,4'-bisdiazodiphenylamine dichloride to 100 parts by weight of an aqueous gelatin solution having a solid content of 20 wt%. The composition was applied onto the colored transparent layer by the use of a spinner (Model 1H-D2, made by Mikasa Co., Ltd.) and pre-baked at 40° C. for 20 minutes. The composition layer was maintained in face-to-face relation to a 1% ammonia solution at a distance of 5 cm from the solution surface for times indicated in Table 1, thereby exposing the layer to the ammonia vapor. As a result, the pH was maintained at different levels, thereby obtaining sample Nos. 5 to 8.

Photocuring Test

The photosensitive material-applied sample Nos. 1 to 8 were each subjected to a photocuring test to form a relief pattern on the transparent colored layer corresponding to a transmitted visible light spectrum. More particularly, a 500 W xenon lamp (USH 500D, made by Ushio Electric Co., Ltd.) was used for exposure of the sample through the colored transparent layer for 30 seconds, followed by washing with water and post-baking at 70° C. for 10 minutes.

After the photocuring, the sample Nos. 1 to 8 were each subjected to measurement of layer or film thicknesses on the respective color pixels by the use of a thin film and surface profile measuring instrument (alpha step type #100, made by Tencor Instruments Co., Ltd.). The results are shown in Table 1.

TABLE 1

| Sample No. | Water Soluble Polymer | Exposing Time (seconds) | Thickness (micrometers) On Color Pixels | | |
|---|---|---|---|---|---|
| | | | Red | Green | Blue |
| 1 | polyvinyl alcohol | 0 | 0.0 | 0.1 | 1.1 |
| 2 | polyvinyl alcohol | 10 | 0.0 | 0.3 | 1.1 |
| 3 | polyvinyl alcohol | 20 | 0.0 | 0.5 | 1.1 |
| 4 | polyvinyl alcohol | 30 | 0.0 | 0.8 | 0.8 |
| 5 | gelatin | 0 | 0.0 | 0.0 | 1.1 |
| 6 | gelatin | 10 | 0.0 | 0.1 | 1.1 |

TABLE 1-continued

| Sample No. | Water Soluble Polymer | Exposing Time (seconds) | Thickness (micrometers) On Color Pixels | | |
|---|---|---|---|---|---|
| | | | Red | Green | Blue |
| 7 | gelatin | 20 | 0.0 | 0.2 | 1.0 |
| 8 | gelatin | 30 | 0.0 | 0.5 | 0.8 |

As will be apparent from the above results, the thicknesses of the cured layer on the respective color pixels change depending on the time of exposure of the basic gas or the pH of the composition layer.

EXAMPLE 3

A composition of a dichromate in gelatin was applied onto a quartz glass disk plate having a diameter of 50 mm, and subjected to a procedure of patterning and dyeing with red, green and blue dyes, successively thereby forming a colored transparent layer consisting of red, green and blue color pixels. The layer thickness was 1.0 micrometer. A photocurable composition was prepared by dissolving 10 parts by weight of polyvinyl alcohol (PVA117, made by Kurare Co., Ltd.) in 100 parts by weight of distilled water, and adding 0.2 parts by weight of 4,4'-bisdiazodiphenylamine dichloride. To the photocurable composition was added acetic acid or sodium hydrogen carbonate in different amounts to change the pH of the composition from 3 to 10. Each composition was applied onto the colored transparent layer by means of a spinner (type 1H-D2, made by Mikasa Co., Ltd.) in a dry thickness of 1.3 micrometers and pre-baked at 40° C. for 20 minutes.

Subsequently, the pre-baked layer was irradiated with light from a 500 W xenon lamp (USUH 500D, made by Ushio Electric Co., Ltd.) through the transparent colored layer for 30 seconds, followed by washing with water and post baking at 70° C. for 10 minutes to obtain sample Nos. 9 to 12. These samples were subjected to measurement of thicknesses of the cured layer on the respective color pixels of the colored transparent layer by the use of a thin film and surface profile measuring instrument. The results are shown in Table 2, from which it will be found that a desired relief pattern cannot be formed on the transparent colored layer when the pH is 10 or over.

EXAMPLE 4

A composition of a dichromate in gelatin was applied onto a quartz glass disk plate having a diameter of 50 mm, and subjected to patterning and dyeing with red, green and blue dyes, successively, thereby forming a transparent colored layer consisting of red, green and blue color pixels. The layer thickness was 1.0 micrometer. A photocurable composition was prepared by dissolving 10 parts by weight of polyvinyl alcohol (PVA117, made by Kurare Co., Ltd.) in 100 parts by weight of distilled water, and adding 0.2 to 8 wt% by weight of 4,4'-bisdiazodiphenylamine dichloride, based on the polymer. To the photocurable solution was added acetic acid or sodium hydrogen carbonate in different amounts so as to adjust the pH of the solution to 6. Each composition was applied onto the colored transparent layer by means of a spinner (type 1H-D2, made by Mikasa Co., Ltd.) in a dry thickness of 1.3 micrometers and pre-baked at 40° C. for 20 minutes.

Subsequently, the pre-baked layer was irradiated with light from a 500 W xenon lamp (USUH 500D, made by Ushio Electric Co., Ltd.) through the colored transparent layer for 30 seconds, followed by washing with water and post-baking at 70° C. for 10 minutes to obtain sample Nos. 13 to 17. These samples were subjected to measurement of thicknesses of the cured layer on the respective color pixels of the colored transparent layer by the use of a thin film and surface profile measuring instrument. The results are shown in Table 2, revealing that the concentration of the crosslinking agent based on the water-soluble polymer is preferably from 0.5 to 5 wt%.

TABLE 2

| Sample No. | pH | Concentration of Crosslinking Agent (wt %) | Thickness on Color Pixels (micrometers) | | |
|---|---|---|---|---|---|
| | | | Red | Green | Blue |
| 9 | 4 | 2 | 0.0 | 0.1 | 1.1 |
| 10 | 6 | 2 | 0.0 | 0.3 | 1.0 |
| 11 | 8 | 2 | 0.0 | 0.5 | 0.8 |
| 12* | 12 | 2 | no relief pattern left on the colored transparent layer | | |
| 13* | 6 | 0.2 | no relief pattern left on the colored transparent layer | | |
| 14 | 6 | 0.5 | 0.0 | 0.1 | 0.8 |
| 15 | 6 | 2 | 0.0 | 0.4 | 1.0 |
| 16 | 6 | 5 | 0.0 | 0.6 | 1.0 |
| 17* | 6 | 8 | impossible to measure because of the roughness on the surface | | |

*Reference

Although appropriate ranges of the pH and concentration of a crosslinking agent may, more or less, vary depending upon the type of agent, it is preferred that the pH is in the range of from 4 to 8 and the concentration is in the range of from 0.5 to 5 wt%.

What is claimed is:

1. A method for making a relief pattern of a cured resin on an optically transparent colored layer having different color regions, the method comprising
applying a photocurable resin composition comprising a water soluble polymer and about 0.5 to 5 wt% thereof of a photocrosslinking agent having a pH-dependent spectral sensitivity to form a photocurable resin layer, onto the transparent colored layer,
adjusting the pH of the composition to not higher than about 8,
subjecting the adjusted layer to actinic visible light irradiation through the colored transparent layer to cure the resin in the respective regions of the resin layer corresponding to the different color regions in such different degrees that depend on the light transmission through the different color regions, and
developing the irradiated resin layer to form a relief pattern of the cured resin on the colored layer.

2. A method according to claim 1, wherein said polymer is a water-soluble polymer, and said photocrosslinking agent has the formula:

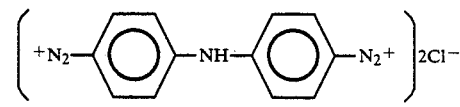

3. A method according to claim 2, wherein said water soluble polymer is polyvinyl alcohol, gelatin or a mixture thereof.

4. A method according to claim 1, wherein the pH adjustment is effected by exposing the layer of the photocurable resin composition to an acidic or basic vapor.

5. A method according to claim 1, wherein the pH adjustment is effected by adding an acidic or basic substance to the photocurable resin composition.

6. A method for making a relief pattern of a cured resin formed on a colored transparent layer of red, green and blue color pixels of a color filter for liquid crystal displays, the method comprising applying a photocurable resin composition comprising a water soluble polymer and about 0.5 to 5 wt% thereof of a photocrosslinking agent having a pH-dependent spectral sensitivity onto the transparent colored layer to form a photocurable resin layer, adjusting the pH of the photocurable resin layer to a value higher than about 8, subjecting the photocurable resin layer to actinic visible light irradiation through the transparent colored layer to photocure the resin in the respective regions on the color pixels in such different degrees that depend on the light transmission through the color pixels, and developing the irradiated layer to form a relief pattern of a photocured resin.

7. A method according to claim 6, further comprising post-baking the developed layer at a temperature of 80° to 150° C.

8. A method according to claim 6, wherein
said polymer is a water-soluble polymer, and
said photocrosslinking agent is present in an amount of about 0.5 to 5 wt% of said water-soluble polymer and has the formula

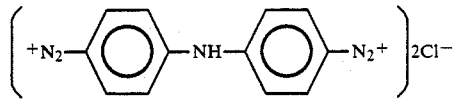

9. A method according to claim 8, wherein said water-soluble polymer is polyvinyl alcohol, gelatin or a mixture thereof.

10. A method according to claim 7, wherein the pH adjustment is effected by exposing the layer of the photocurable resin composition to an acidic or basic vapor.

11. A method according to claim 7, wherein the pH adjustment is effected by adding an acidic or basic substance to the photocurable resin composition.

12. A method according to claim 7, wherein the development is effected by washing the irradiated layer with water.

* * * * *